(12) United States Patent
Horsky

(10) Patent No.: US 6,452,338 B1
(45) Date of Patent: Sep. 17, 2002

(54) ELECTRON BEAM ION SOURCE WITH INTEGRAL LOW-TEMPERATURE VAPORIZER

(75) Inventor: Thomas N. Horsky, Boxborough, MA (US)

(73) Assignee: SemEquip, Inc., Billerica, MA (US)

( * ) Notice: Subject to any disclaimer, the term of this patent is extended or adjusted under 35 U.S.C. 154(b) by 0 days.

(21) Appl. No.: 09/736,097

(22) Filed: Dec. 13, 2000

Related U.S. Application Data

(60) Provisional application No. 60/170,473, filed on Dec. 13, 1999.

(51) Int. Cl.⁷ .................................................. H01J 7/24
(52) U.S. Cl. .................................. 315/111.81; 250/427
(58) Field of Search .................... 315/111.81, 111.91; 250/423 R, 427, 423 F

(56) References Cited

U.S. PATENT DOCUMENTS

| | | | |
|---|---|---|---|
| 2,719,925 A | 10/1955 | Oppenheimer | 250/49.5 |
| 2,733,348 A | 1/1956 | Lawton et al. | 250/41.9 |
| 2,754,422 A | 7/1956 | Lofgren et al. | 250/41.9 |
| 2,813,979 A | 11/1957 | Starr | 250/41.9 |
| 2,882,408 A | 4/1959 | Lofgren | 250/41.9 |
| 3,655,438 A | 4/1972 | Sterling et al. | 117/201 |
| 3,702,973 A | 11/1972 | Daugherty et al. | 331/94.5 PE |
| 3,705,320 A | 12/1972 | Freeman | 313/63 |
| 3,909,304 A | 9/1975 | Cho | 148/1.5 |
| 4,017,403 A | 4/1977 | Freeman | 250/492 A |
| 4,039,828 A | 8/1977 | Pokar et al. | 250/288 |
| 4,135,093 A | 1/1979 | Kim | 250/423 R |
| 4,140,943 A | 2/1979 | Ehlers | 315/111.4 |
| 4,253,026 A | 2/1981 | Veach et al. | 250/426 |
| 4,261,762 A | 4/1981 | King | 148/1.5 |
| 4,272,699 A | 6/1981 | Faubel et al. | 313/360 |
| 4,383,177 A | 5/1983 | Keller et al. | 250/423 R |
| 4,447,732 A | 5/1984 | Leung et al. | 250/427 |

(List continued on next page.)

FOREIGN PATENT DOCUMENTS

| | | |
|---|---|---|
| DE | 4 428 524 | 12/1997 |
| EP | 0 413 982 | 2/1991 |
| EP | 0 417 457 | 3/1991 |
| EP | 0 606 114 | 7/1994 |
| EP | 0 954 008 | 11/1999 |

(List continued on next page.)

OTHER PUBLICATIONS

Brown, "Some Basic Ion Sources", *Lawrences Berkeley Laboratory*; pp. 137–142.
Brown, "The Physics and Technology of Ion Sources"; pp. 17–19.
Donets, "Electron Beam Ion Sources", *Join Institute for Nuclear Research*; pp. 245–279.

(List continued on next page.)

*Primary Examiner*—Don Wong
*Assistant Examiner*—Thuy Vinh Tran
(74) *Attorney, Agent, or Firm*—Katten Muchin Zavis Rosenman

(57) ABSTRACT

An ion source for ion implantation system and a method of ion implantation employs a controlled broad, directional electron beam to ionize process gas or vapor, such as decaborane, within an ionization volume by primary electron impact, in CMOS manufacturing and the like. Isolation of the electron gun for producing the energetic electron beam and of the beam dump to which the energetic beam is directed, as well as use of the thermally conductive members for cooling the ionization chamber and the vaporizer, enable use with large molecular species such as decaborane, and other materials which are unstable with temperature. Electron optics systems, facilitate focusing of electrons from an emitting surface to effectively ionize a desired volume of the gas or vapor that is located adjacent the extraction aperture. The components enable retrofit into ion implanters that have used other types of ion sources. Demountable vaporizers, and numerous other important features, realize economies in construction and operation. Achievement of production-worthy operation in respect of very shallow implants is realized.

35 Claims, 5 Drawing Sheets

U.S. PATENT DOCUMENTS

| | | | |
|---|---|---|---|
| 4,447,773 A | 5/1984 | Aston | 328/233 |
| 4,506,160 A | 3/1985 | Sugawara et al. | 250/427 |
| 4,525,442 A | 6/1985 | Shirai et al. | 430/57 |
| 4,530,669 A | 7/1985 | Gärtner et al. | 445/51 |
| 4,559,477 A | 12/1985 | Leung et al. | 315/111.81 |
| 4,578,589 A | 3/1986 | Aitken | 250/492.2 |
| 4,596,687 A | 6/1986 | Dagenhart | 376/130 |
| 4,641,031 A | 2/1987 | Ito et al. | 250/423 R |
| 4,657,774 A | 4/1987 | Satou et al. | 427/38 |
| 4,693,760 A | 9/1987 | Sioshansi | 148/4 |
| 4,701,379 A | 10/1987 | Pearson et al. | 428/427 |
| 4,714,834 A | 12/1987 | Shubaly | 250/427 |
| 4,719,355 A | 1/1988 | Meyers et al. | 250/425 |
| 4,754,200 A | 6/1988 | Plumb et al. | 315/111.81 |
| 4,762,756 A | 8/1988 | Bergmann et al. | 428/698 |
| 4,774,195 A | 9/1988 | Beneking | 437/16 |
| 4,792,687 A | 12/1988 | Mobley | 250/423 R |
| 4,803,093 A | 2/1989 | Ishihara et al. | 427/35 |
| 4,841,197 A | 6/1989 | Takayama et al. | 315/111.81 |
| 4,851,255 A | 7/1989 | Lagendijk et al. | 427/38 |
| 4,883,968 A | 11/1989 | Hipple et al. | 250/423 R |
| 4,892,752 A | 1/1990 | Fukuda | 427/38 |
| 4,902,572 A | 2/1990 | Horne et al. | 428/409 |
| 4,928,156 A | 5/1990 | Alvis et al. | 357/23.4 |
| 4,957,773 A | 9/1990 | Spencer et al. | 427/39 |
| 5,026,997 A | 6/1991 | Benveniste | 250/492.2 |
| 5,073,507 A | 12/1991 | Keller et al. | 437/22 |
| 5,106,570 A * | 4/1992 | Stein | 315/111.81 |
| 5,124,272 A | 6/1992 | Saito et al. | 437/41 |
| 5,126,278 A | 6/1992 | Kodaira | 437/24 |
| 5,144,143 A | 9/1992 | Raspagliesi et al. | 250/426 |
| 5,158,897 A | 10/1992 | Sato et al. | 437/18 |
| 5,162,699 A | 11/1992 | Tokoro et al. | 315/111.81 |
| 5,254,484 A | 10/1993 | Hefner et al. | 437/24 |
| 5,262,652 A | 11/1993 | Bright et al. | 250/492.2 |
| 5,296,713 A | 3/1994 | Tanaka | 250/423 R |
| 5,306,529 A | 4/1994 | Nishimura | 427/526 |
| 5,340,983 A | 8/1994 | Deinzer | 250/281 |
| 5,354,696 A | 10/1994 | Oostra et al. | 437/18 |
| 5,387,843 A | 2/1995 | Nagayama et al. | 315/111.81 |
| 5,391,962 A | 2/1995 | Roberts et al. | 313/362.1 |
| 5,420,415 A | 5/1995 | Trueira | 250/492.2 |
| 5,453,404 A | 9/1995 | Leedy | 437/203 |
| 5,489,550 A | 2/1996 | Moslehi | 437/165 |
| 5,497,006 A | 3/1996 | Sferlazzo et al. | 250/427 |
| 5,508,208 A | 4/1996 | Sato | 437/18 |
| 5,527,733 A | 6/1996 | Nishizawa et al. | 437/160 |
| 5,640,020 A | 6/1997 | Murakoshi et al. | 250/492.21 |
| 5,661,308 A | 8/1997 | Benveniste et al. | 250/492.21 |
| 5,703,372 A | 12/1997 | Horsky et al. | 250/423 R |
| 5,763,021 A | 6/1998 | Young et al. | 427/579 |
| 5,763,319 A | 6/1998 | Ling et al. | 438/514 |
| 5,763,890 A | 6/1998 | Cloutier | 250/427 |
| 5,920,076 A | 7/1999 | Burgin et al. | 250/492.21 |
| 5,977,552 A | 11/1999 | Foad | 250/492.21 |
| 6,013,332 A | 1/2000 | Goto et al. | 427/530 |
| 6,107,634 A | 8/2000 | Horsky | 250/423 R |
| 6,288,403 B1 * | 9/2001 | Horsky et al. | 250/427 |

FOREIGN PATENT DOCUMENTS

| | | |
|---|---|---|
| EP | 1 093 149 | 4/2001 |
| JP | 58-133368 | 8/1983 |
| JP | 1-225117 | 9/1989 |
| JP | 6-154579 | 3/1994 |
| JP | 6-171906 | 6/1994 |
| JP | 7-94427 | 4/1995 |
| JP | 7-178196 | 7/1995 |
| JP | 08980 | 1/1996 |
| JP | 11-103050 | 4/1999 |

OTHER PUBLICATIONS

Foad et al., "Formation of Shallow Junctions Using Decaborane Molecular Ion Implantation; Comparsion With Molecular Dynamics Simulation", $12^{th}$ International Conference on Ion Implantation Technology, Kyoto, Japan; pp. 32–35 (1998).

Goto et al., "Novel Shallow Junction Technology using Decaborane ($B_{10}H_{14}$)", IEEE; pp. 17.1.1–17.1.4 (1996).

Jacobson et al., "Decaborane, and Alternate Approach to Ultra Low Energy Ion Implantaion", as presented in ITT, Sep. 17–22, 2000, Alpbach, Austria "Abstracts".

Matsuo et al., "Damage Formation with Low Energy Decaborne ($B_{10}H_{14}$) Ion Implantation", as presented in ITT, Sep. 17–22, 2000, Alpbach, Austria "Abstracts".

Matsuo et al., "Gas cluster ion beam equipments for industrial applications", NIMBEU; vol. 99, Nos. 1–4, pp. 244–247 (1995).

Perel et al., "Decaborne Ion Implantation", pp. 1–4.

Smith et al., "Ultrashallow junctions in Si using decaborane? A molecular dynamics simulation study", Journal of Applied Physics; vol. 83, No. 6, pp. 3148–3152 (1998).

Sosnowski et al., "Decaborane As Ion Source Material For Boron Implantation", Mat. Res. Soc. Symp. Proc.; vol. 568, pp. 49–54 (1999).

Takata et al., "The velocity distribution function in an infinitely strong shock wave", Physics of Fluids; vol. 12, No. 8, pp. 2116–2127 (2000).

Takeuchi et al., "Shallow junction formation by polyatomic cluster ion implantation", IEEE; vol. 1, No. 1, pp. 83–89 (1996).

Vella et al., "Decaborane Implantation on a Standard Tool", as presented in ITT, Sep. 17–22, 2000, Alpbach, Austria "Abstract".

Yamada, "A Short review of ionized cluster beam technology", NIMBEU; vol. 99, Nos. 1–4, pp. 240–243 (1995).

Yamada et al., "Cluster Ion Beam Processing of Materials", Proceedings of Ion Implantation Technology; pp. 1002–1005 (1995).

Yamada et al., "Surface modifications by gas cluster ion beams", NIMBEU; vol. 106, Nos. 1–4, pp. 165–169 (1995).

U.S. pat. application Ser. No. 09/416,159, filed Oct. 11, 1999; (Cited in U.S. 6,107,634, but unavailable from United States Patent and Trademark Office).

Excerpts of "Ion Implantation Technology", Edited by J.F. Ziegler; IBM–Research, Yorktown Heights, New York U.S.A. (1992).

* cited by examiner

US 6,452,338 B1

ELECTRON BEAM ION SOURCE WITH INTEGRAL LOW-TEMPERATURE VAPORIZER

CROSS REFERENCE TO RELATED APPLICATIONS

This application claims the benefit of U.S. provisional application No. 60/170,473, filed on Dec. 13, 1999.

BACKGROUND OF THE INVENTION

1. Field of the Invention

The present invention relates to the design and operation of an ion source for use in the ion implantation of semiconductors, and for the modification of the surfaces of materials. The ion source can be retrofitted into the existing fleet of ion implanters currently used in the manufacture of semiconductor devices, particularly those used in Complementary Metal-Oxide Semiconductor (CMOS) manufacturing. The ion source is specifically designed to accommodate the use of new solid feed materials such as decaborane ($B_{10}H_{14}$) and Trimethyl Indium (TMI), which vaporize at sufficiently low temperatures that currently available ion implant ion sources cannot use them. Indeed, the currently available (ion sources result in disassociation of decaborane when that material is introduced into tLem. The ion source has an integral low-temperature vaporizer, and a means of introducing the vaporized feed material into an ionization chamber which is also temperature controlled by the vaporizer. The feed material is ionized by a variable energy, variable current, wide-area electron beam which passes through the ionization chamber, but is largely prevented from interacting with the chamber walls. The ion source also incorporates a gas feed for introducing gaseous materials from pressurized gas cylinders.

2. Description of the Prior Art

Ion implantation is a key enabling technology in the manufacture of integrated circuits (IC's). In the manufacture of logic and memory IC's, ions are implanted into silicon or GaAs wafers to form the transistor junctions, and to dope the well regions of the pn junctions. By varying the energy of the ions, their implantation depth into the silicon can be controlled, allowing three-dimensional control of the dopant concentrations introduced by ion implantation. The dopant concentrations control the electrical properties of the transistors, and hence the performance of the IC's. A number of different electrically active dopant materials are used, including As, B, P, In, Sb, Be, and Ga. Many of these materials can be obtained in gaseous chemical form, for example as $AsH_3$, $PH_3$, $BF_3$, $PH_3$, and $SbF_5$. The ion implanter is a manufacturing tool which ionizes the dopant-containing feed materials, extracts the dopant ions of interest, accelerates the dopant ion to the desired energy, filters away undesired ionic species, and then transports the dopant ion of interest to the wafer. Thus, the following variables must be controlled in order to achieve the desired implantation profile for a given implantation process:

Dopant feed material (e.g., $BF_3$ gas)

Dopant ion (e.g., $B^+$)

Ion energy (e.g., 5 keV)

Chemical purity of the ion beam (e.g., <1% contaminants)

Energy purity of the ion beam (e.g., <2% FWHM).

An area of great importance in the technology of ion implantation is the ion source. FIG. 1 shows the "standard" technology for commercial ion sources, namely the "Enhanced Bernas" ion source. This type of source is commonly used in high current, high energy, and medium current ion implanters. The ion source a is mounted to the vacuum system of the ion implanter through a mounting flange b which also accommodates vacuum feedthroughs for cooling water, thermocouples, dopant gas feed, $N_2$ cooling gas, and power. The dopant gas feed c feeds gas into the arc chamber d in which the gas is ionized. Also provided are dual vaporizer ovens e, f in which solid feed materials such as As, $Sb_2O_3$, and P may be vaporized. The ovens, gas feed, and cooling lines are contained within a cooled machined aluminum block g. The water cooling is required to limit the temperature excursion of the aluminum block g while the vaporizers, which operate between 100 C. and 800 C., are active, and also to counteract radiative heating by the arc chamber d when the source is active. The arc chamber d is mounted to, but in poor thermal contact with, the aluminum block g. The ion source a is an arc discharge source, which means that it operates by sustaining a continuous arc discharge between an immersed hot-filament cathode h and the internal walls of the arc chamber d. Since this arc can typically dissipate in excess of 300 W, and since the arc chamber d cools only through radiation, the arc chamber can reach a temperature in excess of 800 C. during operation.

The gas introduced to arc chamber d is ionized through electron impact with the electron current, or arc, discharged between the cathode h and the arc chamber d. To increase ionization efficiency, a uniform magnetic field i is established along the axis joining the cathode h and an anticathode j by external Helmholz coils, to provide confinement of the arc electrons. An anticathode j (located within the arc chamber d but at the end opposite the cathode h) is typically held at the same electric potential as the cathode h, and serves to reflect the arc electrons confirmed by the magnetic field i back toward the cathode h and back again repeatedly. The trajectory of the thus-confined electrons is helical, resulting in a cylindrical plasma column between the cathode h and anticathode j. The plasma density within the plasma column is typically high, on the order of $10^{12}$ per cubic centimeter; this enables further ionizations of the neutral and ionized components within the plasma column by charge-exchange interactions, and also allows for the production of a high current density of extracted ions. The ion source a is held at a potential above ground (i.e., the silicon wafer potential) equal to the accelerating voltage $V_a$ of the ion implanter: the energy of the ions E as they impact the wafer substrate is given by $E=qV_a$, where q is the electric charge per ion.

The cathode h is typically a hot filament or indirectly-heated cathode, which thermionically emits electrons when heated by an external power supply. It and the anticathode are typically held at a voltage $V_c$ between 60V and 150V below the potential of the ion source $V_a$. High discharge currents D can be obtained by this approach, up to 7A. Once an arc discharge plasma is initiated, the plasma develops a sheath adjacent to the surface of the cathode h (since the cathode h is immersed within the arc chamber and is thus in contact with the resulting plasma). This sheath provides a high electric field to efficiently extract the thermionic electron current for the arc; high discharge currents can be obtained by this method.

The discharge power P dissipated in the arc chamber is $P=DV_c$, or hundreds of watts. In addition to the heat dissipated by the arc, the hot cathode h also radiates power to the arc chamber d walls. Thus, the arc chamber d provides a high temperature environment for the dopant plasma, which also boosts ionization efficiency relative to a cold environment by increasing the gas pressure within the arc chamber d, and by preventing substantial condensation of dopant material on the hot chamber walls.

If the solid source vaporizer ovens e or f are used, the vaporized material feeds into the arc chamber d through vaporizer feeds k and 1, and into plenums m and n. The plenums serve to diffuse the vaporized material into the arc chamber d, and are at about the same temperature as the arc chamber d. Radiative thermal loading of the vaporizers by the arc chamber also typically prevents the vaporizers from providing a stable temperature environment for the solid feed materials contained therein below about 100 C. Thus, only solid dopant feed materials that both vaporize at temperatures >100 C. and decompose at temperatures >800 C. can be vaporized and introduced by this method.

A very significant problem which currently exists in the ion implantation of semiconductors is the limitation of ion implantation technology to effectively implant dopant species at low (e.g., sub-keV) energies. One critically important application which utilizes lowenergy dopant beams is the formation of shallow transistor junctions in CMOS manufacturing. As transistors shrink in size to accommodate the incorporation of more transistors per IC, the transistors must be formed closer to the silicon surface. This requires reducing the velocity, and hence the energy, of the implanted ions. The most critical need in this regard is the implantation of low-energy boron, a p-type dopant. Since boron atoms have low mass, at a given energy they penetrate deeper into the silicon than other p-type dopants, and must therefore be implanted at lower energies. Ion implanters are inefficient at transporting low-energy ion beams due to the space charge within the ion beam causing the beam profile to grow larger (beam blow-up) than the implanter's transport optics, resulting in beam loss through vignetting. In addition, known ion sources rely on the application of a strong magnetic field in the source region. Since this magnetic field also exists in the beam extraction region of the implanter, it deflects the lowenergy beam and substantially degrades the emittance properties of the beam, further reducing beam transmission through the implanter. For example. at 500 eV transport energy, many ion implanters currently in use cannot transport enough boron beam current to be useful in manufacturing; i.e., the wafer throughput is too low.

Recently, a new enabling technology has been pursued to solve the problem of low-energy boron implantation: molecular beam ion implantation. Instead of implanting an ion current I of atomic $B^+$ ions at an energy E, a decaborane molecular ion, $B_{10}H_x^+$, is implanted at an energy $10 \times E$ and an ion current of $0.10 \times I$. The resulting implantation depth and dopant concentration (dose) of the two methods have been shown to be equivalent, but the decaborane implantation technique has significant advantages. Since the transport energy of the decaborane ion is ten times that of the dose-equivalent boron ion, and the ion current is one-tenth that of the boron current, the space charge forces responsible for beam blowup and the resulting beam loss are much reduced relative to monatomic boron implantation.

While $BF_3$ gas can be used by conventional ion sources to generate $B^+$ ions, decaborane ($B_{10}H_{14}$) must be used to generate the decaborane ion $B_{10}H_x^+$. Decaborane is a solid material which has a significant vapor pressure, on the order of 1 Torr at 20 C., melts at 100 C., and decomposes at 350 C. It must therefore be vaporized below 100 C., and operate in an ion source whose local environment (walls of the arc chamber and components contained within the arc chamber) are below 350 C. In addition, since the $B_{10}H_{14}$ molecule is so large, it can easily disassociate (fragment) into smaller components, such as elemental boron or diborane ($B_2H_6$), when subject to charge-exchange interactions within a dense plasma. Therefore, in order to preserve the $B_{10}H_x^+$ ion, the plasma density in the ion source must be low. Also, the vaporizers of current ion sources cannot operate reliably at the low temperatures required for decaborane. This is due to radiative heating from the hot ion source to the vaporizer causing thermal instability, and the fact that the vaporizer feed lines k, l easily become clogged with decomposed vapor as the decaborane vapor interacts with their hot surfaces. Hence, the prior art of implanter ion sources is incompatible with decaborane ion implantation.

SUMMARY OF THE INVENTION

The present invention provides an improved means for efficiently:

Vaporizing decaborane;

Delivering a controlled flow of vaporized decaborane into the ion source;

Ionizing the decaborane into a large fraction of $B_{10}H_x^+$;

Preventing thermal dissociation of decaborane;

Limiting charge-exchange induced fragmentation of $B_{10}H_x^+$;

Operating the ion source without the use of an applied magnetic field, which improves the emittance properties of the beam.

Uses a novel approach to produce electron impact ionizations without the use of an arc discharge, by incorporation of an externally generated electron beam which passes through the ionization chamber.

In addition, the present invention is compatible with current ion implantation technology, such that the ion source can be retrofitted into the existing fleet of ion implanters currently used in the manufacture of semiconductor devices.

DESCRIPTION OF THE DRAWING

These and other advantages will be readily understood with reference to the following specification and attached drawing wherein.

DETAILED DESCRIPTION OF THE INVENTION

Figure 1:
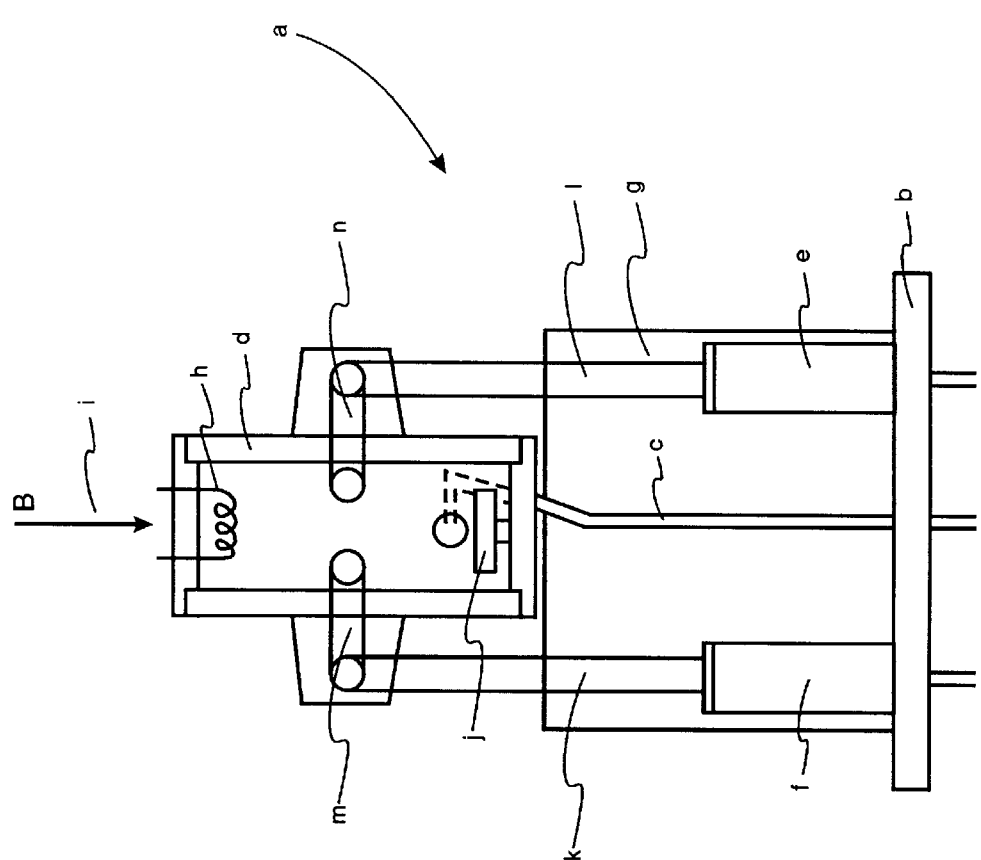
FIG. 1 is a diagrammatic view of a prior art ion source known as an enhanced Bernas ion source.

An ion source for the generation of ions for use in ion implantation is described that may be configured to be compatible with the designs of commercial ion implanters commonly in use in semiconductor manufacturing and in the surface modification of materials. Such an ion source can be readily retrofitted into commercial ion implanters as a direct replacement for their commercial ion source.

The ion source described herein is composed of a i) vaporizer, ii) vaporizer valve, iii) gas feed, iv) ionization chamber, v) electron gun, vi) source shield, and vii) exit aperture. In particular, means for introducing gaseous feed material into an ionization chamber, means for vaporizing and introducing solid feed materials into the ionization chamber, and means for extracting the ions thus produced from an exit aperture adjacent to the ionization chamber are described. In addition, means for accelerating and focusing the exiting ions is described. The vaporizer, vaporizer valve, gas feed, ionization chamber, electron gun, source shield, and exit aperture are all integrated into a single assembly collectively identified as the ion source.

Vaporizer: the vaporizer is designed for vaporizing solid materials, such as decaborane ($B_{10}H_{14}$) and TMI (Trimethyl Indium), which have relatively high vapor pressures at room temperature, and thus vaporize at temperatures below 100 C. For example, solid decaborane has a vapor pressure of about 1 Torr at 20 C. Most other implant species currently of interest in the ion implantation of semiconductors, such as As, P, Sb, B, C, Ar, N, Si, and Ge are available in gaseous forms (e.g., $A_sH_3$, $PH_3$, $SbF_5$, $BF_3$,$CO_2$, Ar, $N_2$, $SiF_4$, and $GeF_4$ gases). However, $B_{10}$ and In are not, but can be vaporized from decaborane and TMI. The vaporizer is a machined aluminum block wherein resides a sealed crucible containing the solid material to be vaporized, entirely surrounded by a closed-circuit water bath, which is itself enclosed by the aluminum block. The bath is held at a well-defined temperature by a closed-loop temperature control system linked to the vaporizer. The closed-loop temperature control system incorporates a PID (Proportional Integral Differential) controller which accepts a user-programmable temperature setpoint, and activates a resistive heater (which is mounted to a heater plate in contact with the water bath) to reach and maintain its setpoint temperature through a thermocouple readback circuit which compares the setpoint and readback values to determine the proper value of current to pass through the resistive heater. To ensure good temperature stability, a water-cooled heat exchanger coil is immersed in the water bath to continually remove heat from the bath, which reduces the settling time of the temperature control system. The temperature difference between the physically separate heater plate and heat exchanger coil provides flow mixing of the water within the bath through the generation of convective currents. As an added mixing aid, a rotating magnetic mixer paddle can be incorporated into the water bath. Such a temperature control system is stable from 20 C. to 100 C. The flow of gas from the vaporizer to the ionization chamber is determined by the vaporizer temperature, such that at higher temperatures, higher flow rates are achieved.

An alternative embodiment of the operation of the vaporizer PID temperature controller is described as follows. In order to establish a more repeatable and stable flow, the vaporizer PID temperature controller receives the output of an ionization-type pressure gauge which is typically located in the source housing of commercial ion implanters to monitor the sub-atmospheric pressure in the source housing. Since the ionization gauge output is proportional to the gas flow into the ion source, its output can provide an input to the PID temperature controller. The PD temperature controller can subsequently raise or diminish the vaporizer temperature, thus increasing or decreasing gas flow into the source, until the desired gauge pressure is attained. Thus, two complementary operating modes of the PID temperature controller are defined: temperature-based, and pressure-based. These two approaches can be combined so that short-term stability of the flow rate is accomplished by temperature programming alone, while long-term stability of the flow rate is accomplished by adjusting the vaporizer temperature to meet a pressure setpoint. The advantage of such an approach is that, as the solid material in the vaporizer crucible is consumed, the vaporizer temperature can be increased to compensate for the smaller flow rates realized by the reduced surface area of the material presented to the vaporizer.

In an alternate embodiment of the, above-described vaporizer, a water bath is not used. Rather, the crucible is integral to the machined body of the vaporizer, and heating and cooling elements are embedded into the aluminum wall of the vaporizer. The heating element is a resistive or ohmic heater, and the cooling element is a thermoelectric (TE) cooler. The vaporizer is also encased in thermal insulation to prevent heat loss to the ambient, since the desired vaporizer temperature is typically above room temperature. In this embodiment, the heating/cooling elements directly determine the temperature of the walls of the vaporizer, and hence the material within the crucible, since said material is in direct contact with the walls of the vaporizer which is machined of a single piece of aluminum. The same PID temperature controller can be used as in the embodiment described above.

Vaporizer valve: In the above described vaporizer embodiments, the vaporized material enters the adjacent ionization chamber of the ion source through an aperture, which is coupled to a thin, metal-sealed gate valve placed between the vaporizer and ionization chamber. The gate valve serves to separate the vaporizer from the ionization chamber, so that no vapor escapes the vaporizer when the valve is shut, but a short, high-conductance line-of-sight exists between the ionization chamber and vaporizer when the valve is open, thus allowing the vapors to enter the ionization chamber. With the valve in the closed position, the vaporizer may also be removed from the ion source without releasing the vaporizer material contained in the crucible. The ion source may then be sealed by installing a blank flange in the position previously occupied by the vaporizer valve.

Gas feed: In order to run gaseous feed materials, ion implanters typically use gas bottles which are coupled to a gas distribution system. The gases are fed to the ion source via metal gas feed lines which directly couple to the ion source through a sealed VCR or VCO fitting. In order to utilize these gases, the herein described ion source likewise has a gas fitting which couples to the interior of the ionization chamber.

Ionization chamber: The ionization chamber is where the neutral gas fed or vaporized into the source is ionized by electron impact. The ionization chamber is in intimate thermal and mechanical contact with the vaporizer valve through a thermally conductive metal gasket, which is likewise in intimate thermal contact with the vaporizer through a thermally conductive, thin metal gasket. This provides temperature control of the ionization chamber through thermal contact with the vaporizer. This feature is important, since the plasma generated in the ionization chamber can heat the walls of the chamber to temperatures which can cause decaborane or other low-temperature vaporized materials to break down and disassociate. The ionization chamber is rectangular, made of a single piece of machined aluminum, molybdenum, graphite, or other suitable thermally conductive material. The ionization chamber is approximately 3 inches tall by 2 inches wide by 2 inches deep; the chamber wall thickness is approximately 0.38 inch. Thus, the ionization chamber has the appearance of a hollow, rectangular five-sided box. The sixth side is occupied by the exit aperture, which we will describe later. The flow rate of the gas fed into the ionization chamber must be sufficient to maintain proper feed gas pressure within the ionization chamber. For most materials, including decaborane, a pressure between 0.5 mTorr and 5 mTorr will yield good ionization efficiency. We note that the ion gauge mounted in the source housing, typically used in commercial ion implanters to monitor source pressure, would read between $1 \times 10^{-5}$ Torr and $1 \times 10^{-4}$ Torr. The flow rate from the vaporizer or gas feed into the ionization chamber required to sustain this pressure would be between 1 sccm and 5 sccm (standard cubic centimeters per minute).

Electron gun: In order to ionize the gases within the ionization chamber, energetic electrons must be introduced into the ionization chamber. Accordingly, a high-current electron gun is mounted adjacent to one end of the ionization chamber, but external to that chamber, such that a directed stream of energetic electrons is injected into the ionization chamber along the long axis of the rectangular chamber. The cathode of the electron gun is held at an electric potential below the potential of the ionization chamber by a voltage equal to the desired energy of the electron beam. Two apertures are provided in the ionization chamber wall to accommodate the electron beam, one aperture for entrance of the beam and a second aperture for the exit of the beam. After the electron beam exits the ionization chamber, it is intercepted by a beam dump located just outside of the ionization chamber. The electron beam is of a variable energy and current to accommodate the specific ionization needs of the various feed materials introduced into the ionization chamber, and also the specific ion currents required by the ion implant processes of the end-user. In particular, the electron gun provides an electron beam energy programmable between 20 eV and 1 keV. The lowest beam energies in this energy range would accommodate selective ionization of the gas below certain ionization threshold energies, limiting the different kinds of end-product ions produced from the neutral gas species. An example would be producing $B_{10}H_x^+$ ions without significant production of $B_9H_x^+$, $B_8H_x^+$, and other lower-order boranes frequently contained in the decaborane cracking pattern when higher electron impact energies are used. The highest beam energies in the energy range of the electron gun would accommodate the formation of multiply-charged ions, for example, B++ and $B^{3+}$ from $BF_3$ feed gas. For the majority of ion production from the various feed gases used in semiconductor manufacturing, including the production of $B_{10}H_x^+$ from decaborane, an electron beam energy between 50 eV and 150 eV would yield good results.

The electron beam also accommodates a range of injected electron beam currents between 1 mA and 5 A, in order to determine the ion current extracted from the ion source. Control of electron current is accomplished by a closed-loop electron gun controller which adjusts the electron emitter temperature and the electron gun grid potential to maintain the desired electron current setpoint. The electron emitter, or cathode, emits electrons by thermionic emission. It must therefore operate at elevated temperatures. To this end, the cathode may be directly heated (by passing an electric current through the cathode material), or indirectly heated. Cathode heating by electron bombardment from a hot filament held behind the cathode is an indirect heating technique well-practiced in the art. The cathode may be made of tungsten, tantalum, lanthanum hexaboride ($LaB_6$), or other refractory conductive material. $LaB_6$ would offer a particular advantage, in that it emits copious currents of electrons at lower temperatures than tungsten or molybdenum.

The shape of the electron beam has a rectangular cross section; approximately 0.75 inch×0.25 inch as injected into the ionization chamber. The shape of the injected electron beam is determined by the shapes of the grid and anode apertures in the electron gun, which are both approximately 0.75 inch×0.25 inch, and also by the shape of the cathode or electron emitter, which is somewhat larger than the grid and anode apertures, approximately 0.9 inch×0.35 inch. The purpose of generating a rectangular electron beam profile is to match the desired ion beam profile as extracted from the ion source, which is also rectangular. The rectangular exit aperture from which the ion beam is extracted is approximately 2 inches tall by 0.5 inch wide; the electron beam (and thus the ions produced by electron impact) would present a profile to the exit aperture within the ionization chamber of approximately 2.5 inch×0.75 inch.

There is both an entrance and exit aperture for the electron beam, which departs from the prior art. Prior art allows the energetic electrons produced by an emitter internal to the ionization chamber to strike the walls of the chamber; this forms the basis of an "arc discharge" ion source, and also provides a substantial heat load which elevates the temperature of the ionization chamber. In our invention, the ionizing electrons (called energetic or "primary" electrons) pass through the ionization chamber, substantially without intercepting the chamber walls. However, the "secondary" electrons, or the low-energy electrons produced by ionization of the feed gas, can strike the ionization chamber walls. Since these are low energy electrons, they do not provide a significant heat load to the ionization chamber. This feature allows the ionization chamber to be conductively cooled by the vaporizer without providing a large heat load on the vaporizer temperature controller. To further contain the heat generated by the electron gun and the energetic electron beam, both the electron gun and the electron beam dump are mounted on a water-cooled shield, called the source shield. This shield is cooled by low-resistivity, de-ionized water commonly provided in commercial ion implanters.

Source shield: The source shield is a water-cooled sheet metal assembly on which the electron gun and the electron beam dump are mounted. By mounting these two components to the water-cooled shield, the heat load to the ionization chamber can be substantially reduced. The shield provides a mechanical framework for the thus-mounted components, and in addition the shield and the mounted components can be held at an electric potential different from the potential of the ionization chamber and vaporizer by mounting the shield to the source on electrically insulating standoffs. There are two embodiments of the source shield: the first embodiment maximizes the conductance of the ion source to the vacuum system of the ion implanter, and the second embodiment minimizes that conductance. To clarify, in the first embodiment the shield has two projections, one for mounting the electron gun, and the second for mounting the beam dump. The projections need be only lightly larger in diameter than these two components to accomplish its function of providing mechanical stability and cooling to these components. However, if the shield were rather of a rectangular or cylindrical design, it would shield the source assembly from the vacuum housing it resides in within the implanter. The advantage of this approach would be to protect the implanter components from contamination from the gases fed into the ion source during operation, reducing implanter maintenance requirements. The second embodiment would also reduce the gas conductance from the source to the implanter vacuum system, increasing the pressure differential between the ionization chamber and the implanter vacuum system. This feature would result in a reduction in the gas flow into the ionization chamber required to maintain the ionization chamber at a given feed gas pressure.

In an alternate embodiment of the invention, the electron beam dump is biased to a negative potential relative to the ionization chamber, at approximately the cathode potential, allowing for a "reflex geometry" whereby the primary electrons emitted by the electron gun are reflected from the beam dump back into the ionization chamber and to the cathode, and back again repeatedly. An axial magnetic field may also be established along the direction of the electron beam by the introduction of a pair of Helmholtz coils external to the ion source, to provide confinement of the primary electron beam as it is reflected back and forth between the cathode and beam dump. This feature also provides some confinement for the ions, increasing the efficiency of creating certain desired ion products, for example $B^+$ from $BF_3$, feed gas.

Figure 2:
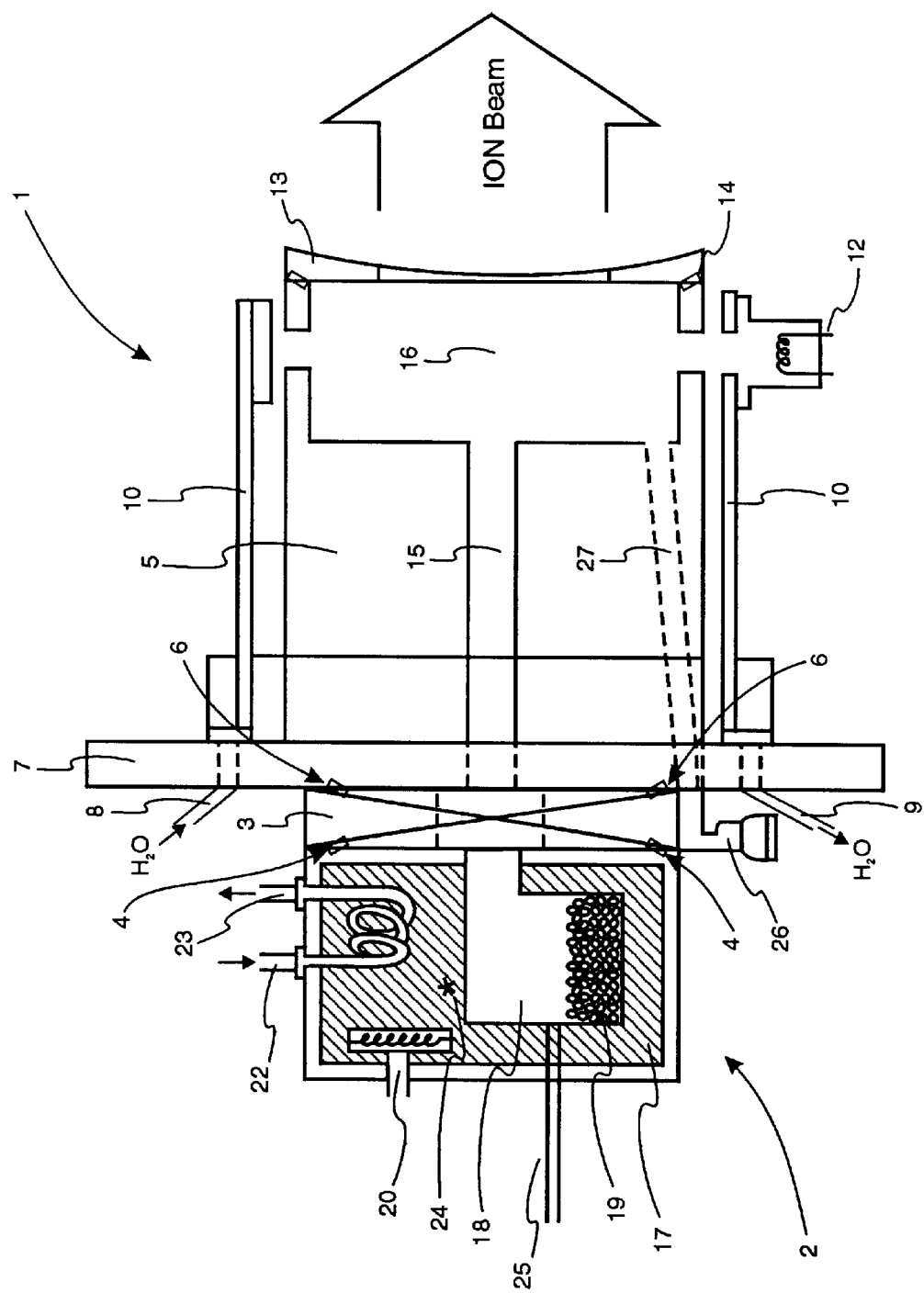
FIG. 2 is a side-elevational view in cross-section of an ion source in accordance with the present invention.

FIG. 2 shows in schematic the first embodiment of the ion source 1. The vaporizer 2 is attached to the vaporizer valve 3 through a annular metal gasket 4. The vaporizer valve 3 is likewise attached to the ionization chamber 5 by a second annular metal gasket 6. This ensures good thermal conduction between the vaporizer, vaporizer valve, and ionization chamber 5 through intimate contact via thermally conductive elements. A mounting flange 7 attached to the ionization chamber 5 allows mounting of the ion source 1 to the vacuum housing of an ion implanter, and contains electrical feedthroughs (not shown) to power the ion source, and watercooling feedthroughs 8, 9 to cool the ion source. In the preferred embodyment of the invention, water feedthroughs 8, 9 circulate water through the source shield 10 to cool the source shield 10 and cool the attached components, the beam dump 11 and electron gun 12. The exit aperture 13 is mounted to the ionization chamber 5 face by metal screws (not shown). Thermal conduction of the exit aperture 13 to the ionization chamber 5 is aided by an annular seal 14 which can be made from metal or a thermally conductive polymer.

When the vaporizer valve 3 is in the open position, vaporized gases from the vaporizer 2 can flow through the vaporizer valve 3 to inlet channel 15 into the open volume of the ionization chamber 5. These gases are ionized by interaction with the electron beam transported from the electron gun 12 to the beam dump 11. The ions can then exit the ion source from the exit aperture 13, where they are collected and transported by the ion optics of the ion implanter.

The vaporizer 2 is made of machined aluminum, and houses a water bath 17 which surrounds a crucible 18, wherein resides solid feed materials such as decaborane 19. The water bath 17 is heated by a resistive heater plate 20 and cooled by a heat exchanger coil 21 to keep the water bath at the desired temperature. The heat exchanger coil 21 is cooled by de-ionized water provided by water inlet 22 and water outlet 23. Although the temperature difference between the heating and cooling elements provides convective mixing of the water, a magnetic paddle stirrer 24 continuously stirs the water bath 17 while the vaporizer is in operation. A thermocouple 25 continually monitors the temperature of the crucible 18 to provide temperature read-back for a PID vaporizer temperature controller (not shown). The ionization chamber 5 is made of aluminum, graphite, or molybdenum, and operates near the temperature of the vaporizer 2 through thermal conduction. In addition to low-temperature vaporized solids, the ion source can receive gases through gas feed 26, which feeds directly into the open volume of the ionization chamber 16 by an inlet channel 27. Typical feed gases provided for the ion implantation of semiconductors are $AsH_3$, $PH_3$, $SbF_5$, $BF_3$, $CO_2$, Ar, $N_2$, $SiF_4$, and $GeF_4$. When the gas feed 26 is used to input feed gases, the vaporizer valve 3 is closed.

The vaporizer can be demounted from the ion source 1 by closing the vaporizer valve 3 and removing the seal 6. This is useful for recharging the solid feed material in the crucible 18, and for maintenance activities.

Figure 3:
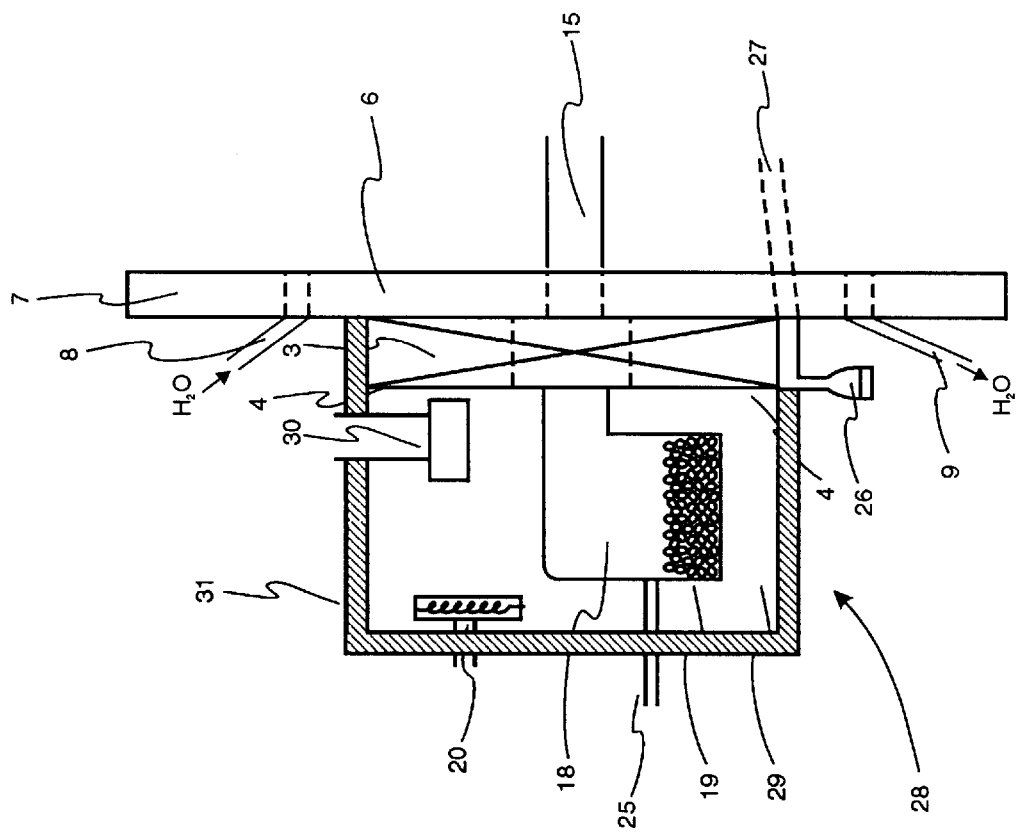
FIG. 3 is an elevational view in cross-section of an alternative embodiment of a vaporizer for use with the ion source in accordance with the present invention.

Referring now to FIG. 3, an alternative embodiment of the ion source is described, whereby the vaporizer 2 is of a different design. However, the rest of the ion source 2 is the same as in FIG. 2 previously described. In the second embodiment of the vaporizer 28, there is no water bath or water-fed heat exchanger. Instead, the volume previously occupied by the water bath 17 is occupied by the machined aluminum body 29 of the vaporizer 28. A resistive heater plate 20 is in direct contact with the vaporizer body 29 to heat the body 29, and a thermoelectric (TE) cooler 30 is in direct contact with the vaporizer body 29 to provide cooling. A thermally insulating sleeve 31 surrounds the vaporizer 28 to thermally insulate the vaporizer from ambient temperature. If desired, several heater plates 20 and TE coolers 30 can be distributed within the vaporizer body 29 to provide more heating and cooling power, and also to provide a more spatially uniform temperature to the crucible.

Figure 4:
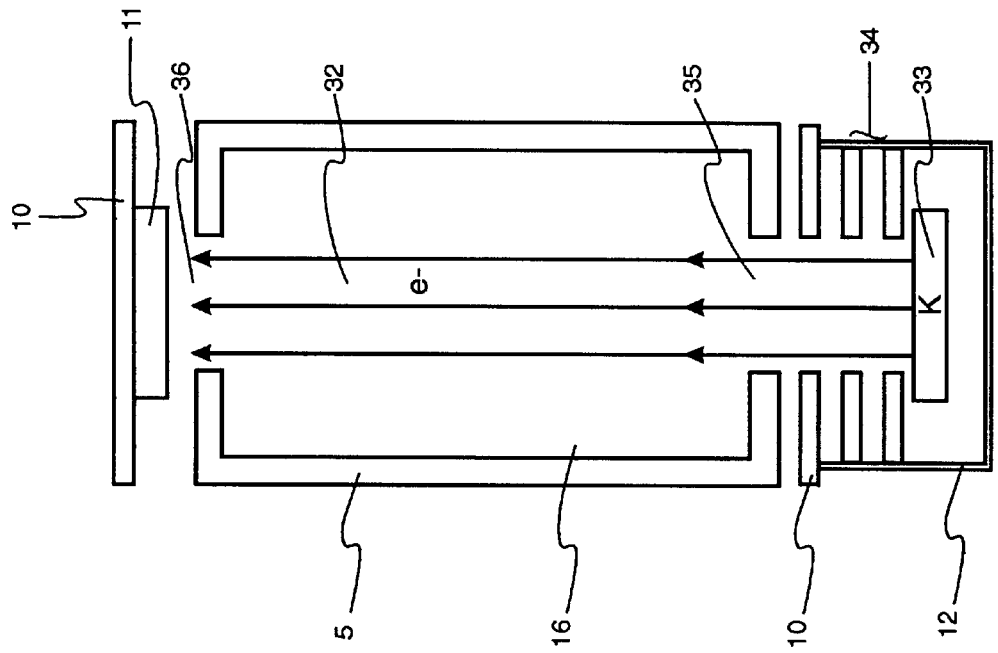
FIG. 4 is an elevational view of a portion of the ionization chamber, shown with the exit aperture plate removed, illustrating the configuration of the electron source within the ionization chamber.
Figure 6:
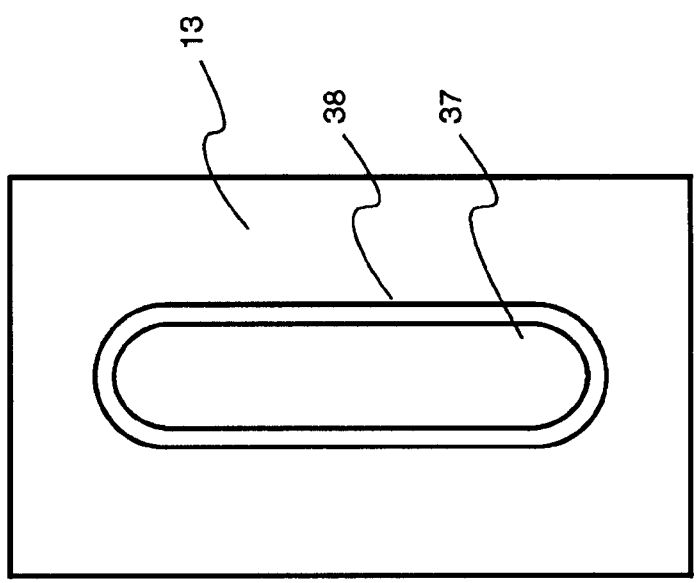
FIG. 6 is a front elevational view of the ion source illustrated in FIG. 2, illustrating the extraction aperture.

Referring now to FIG. 4, the operation of the ion source is described. An electron beam 32 is emitted from the cathode 33 and focused by the electron optics 34 to form a wide beam. The electron beam is asymmetric, in that it is wider perpendicular to the ion beam axis than it is along that axis. FIG. 4 illustrates the geometry of the ion source with the exit aperture removed; the ion beam axis points out of the plane of the paper. The distribution of ions created by neutral gas interaction with the electron beam roughly corresponds to the profile of the electron beam. Since the exit aperture 13 shown in FIG. 6 is a wide, rectangular aperture, the distribution of ions created adjacent to the aperture 13 should be uniform. Also, in the ionization of decaborane and other large molecules, it is important to maintain a low plasma density in the ion source This limits the charge-exchange interactions between the ions which can cause loss of the ions of interest. Since the ions are generated in a widely distributed electron beam, this will reduce the local plasma density relative to other conventional ion sources known in the art. The electron beam passes through a rectangular entrance channel 35 in the ionization chamber and interacts with the neutral gas within the open volume 16. It then passes through a rectangular exit channel 36 in the ionization chamber and is intercepted by the beam dump 11, which is mounted onto the water-cooled source shield 10. Since the heat load generated by the hot cathode 33 and the heat load generated by impact of the electron beam 32 with the beam dump 11 is substantial, these elements are kept outside of the ionization chamber open volume 16 where they cannot cause dissociation of the neutral gas molecules and ions. In addition, the only heat load from these elements to the ionization chamber is through radiation, so the ionization chamber can be effectively cooled by thermal contact with the vaporizer 2. Thus, the ionization chamber walls can be maintained at a temperature below the dissociation temperature of the neutral gas molecules and ions. For decaborane, this dissociation temperature is about 350 C.

Figure 5:
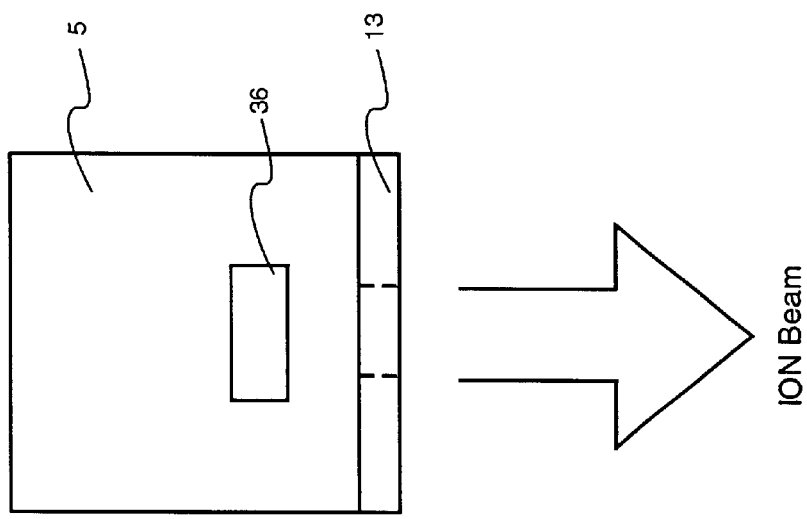
FIG. 5 is a top view of the ionization chamber shown with the top wall removed, illustrating the electron exit channel and its proximity to the extraction aperture.

FIG. 5 shows a top view of the exit channel 36 in the ionization chamber 5, and its proximity to the exit aperture 13. Since the ions are removed from the ionization chamber by penetration of an electrostatic extraction field outside of the ion source 1 through the exit aperture 13, the electron beam 32 and exit channel 36 are close to the exit aperture 13, allowing for more efficient removal of ions. Although the electron beam 32 may not fully retain its rectangular profile due to scattering, and also due to space charge forces within the electron beam 32, the exit channel 36 can still be sized to allow passage of the electron beam without significant interception by the ionization chamber 5.

Referring now to FIG. 6, the figure shows the exit aperture 13 with the axis of the ion beam directed normal to the plane of the paper. The dimensions of the exit aperture plate conform to the dimensions of the ionization chamber 5, approximately 3 inches tall x2 inches wide. The exit aperture contains an opening 37 which is approximately 2 inches tall x0.5 inch wide, and has a bevel 38 to reduce strong electric fields at its edges.

Figure 7:
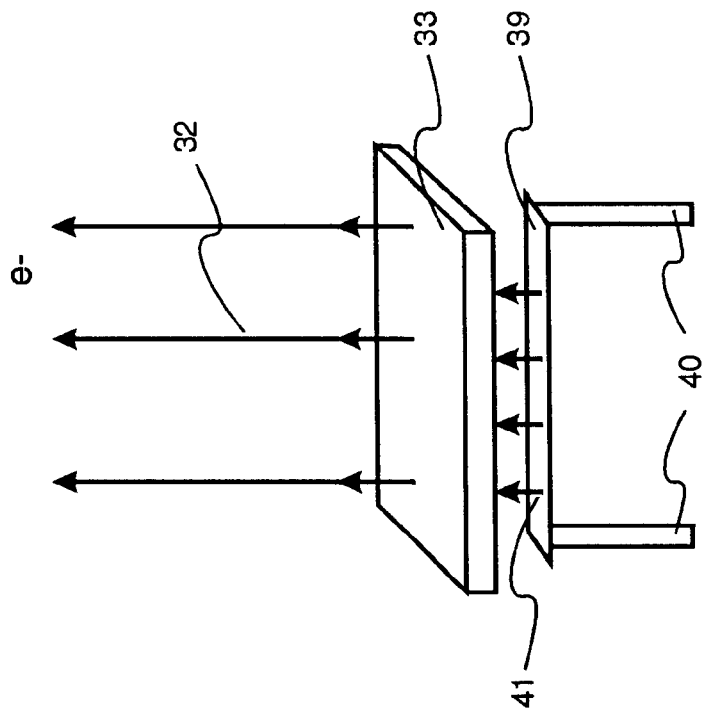
FIG. 7 is a perspective view of an exemplary embodiment of a cathode arrangement for use with the present invention.

Referring now to FIG. 7, the figure shows the shape of the cathode 33, or electron emitter. Its dimensions are roughly 0.9 inch long x0.35 inch wide x0.125 inch thick. It can be directly heated by passing an electric current through it, or it can be indirectly heated. We show the preferred embodiment, that of an indirectly-heated cathode. An electric current flows through a filament 39 through leads 40, heating the filament 39 to emit thermionic electrons 41. By biasing the filament 39 to a voltage several hundred volts below the potential of the cathode 33, the thermionic electrons 41 will heat the cathode 33 by energetic electron bombardment, as is known in the art.

What is claimed and desired to be secured by a Letters Patent of the United States is:

1. An ion source capable of providing ions in commercial ion current levels to the ion extraction system of an ion implanter, the ion source comprising:
    an ionization chamber defined by walls enclosing an ionization volume, there being an elongated ion extraction aperture defining first and second axes in a side wall of the ionization chamber and a pair of aligned electron beam apertures, the ion extraction aperture having a length and width sized and arranged to enable the ion current to be extracted from said ionization volume by said extraction system;
    a broad beam electron gun disposed external to the ionization chamber to direct a generally dispersed beam of primary electrons through said pair of aligned electron beam apertures in the ionization chamber to a beam dump, disposed external to said ionization chamber and aligned with one of said pair of aligned election beam apertures, the beam dump being maintained at a substantial positive voltage relative to the emitter voltage of the electron beam gun, the axis of the beam path of said primary electrons extending in a direction generally perpendicular to the direction of said ion current, and parallel to one of said first or second axes of the ion extraction aperture;
    a vaporizer arranged to introduce a vapor into the ionization volume; and
    a control system enabling control of the energy of the primary electrons so that individual vapor molecules can be ionized principally by collisions with primary electrons from the electron gun.

2. The ion source of claim 1 in which the electron gun is mounted on a support that is thermally isolated from the walls of the ionization chamber.

3. An ion source capable of providing ions in commercial ion current levels to the ion extraction system of an ion implanter, the ion source comprising an ionization chamber defined by walls enclosing an ionization volume, there being an extraction aperture in a side wall of the ionization chamber, arranged to enable the ion current to be extracted from said ionization volume by said extraction system, an electron gun mounted on a support that is outside of and thermally isolated from the walls of the ionization chamber, and constructed, sized and arranged with respect to the ionization chamber to direct a broad beam of primary electrons through the ionization chamber to a beam dump maintained at a substantial positive voltage relative to the emitter voltage of the electron beam gun, the beam dump being located outside of, and thermally isolated from, the ionization chamber, the beam path of said primary electrons extending in a direction adjacent to the ion extraction aperture, a passage arranged to introduce vapor or gas of a selected material to the ionization volume, and a control system enabling control of the energy of the primary electrons so that the material can be ionized.

4. An ion source capable of providing ions in commercial ion current levels to the ion extraction system of an ion implanter, the ion source comprising an ionization chamber defined by walls enclosing an ionization volume, there being an extraction aperture in a side wall of the ionization chamber that is arranged to enable the ion current to be extracted from said ionization volume by said extraction system, an electron gun mounted on a support that is outside of and thermally isolated from the walls of the ionization chamber, and constructed, sized and arranged with respect to the ionization chamber to direct a broad beam of primary electrons through the ionization chamber to a beam dump maintained at a substantial positive voltage relative to the emitter voltage of the electron beam gun, the electron beam gun comprising a heated electron emitting surface followed by electron optical elements that focus the electrons to form a wide beam, the beam path of said primary electrons extending in a direction adjacent to the ion extraction aperture, a passage arranged to introduce vapor or gas of a selected material to the ionization volume, and a control system enabling control of the energy of the primary electrons so that the material can be ionized.

5. The ion source of claim 1, 3 or 4 in which the electron gun forms a broad, generally collimated electron beam.

6. The ion source of claim 4 in which the electrons enter the ionization chamber as a generally collimated beam.

7. The ion source of claim 1, 3 or 4 in which the beam dump is mounted on a dynamically cooled support.

8. The ion source of claim 1, 3 or 4 in which the beam dump is mounted on a water-cooled support.

9. The ion source of claim 1, 3, or 4 in which the electron gun is mounted on a dynamically cooled support.

10. The ion source of claim 1, 3 or 4 in which the electron gun is mounted on a water-cooled support.

11. The ion source of claim 1, 3 or 4 in which the electron gun cathode is disposed in a position substantially remote from the ionization chamber.

12. The ion source of claim 1, 3 or 4 in which the electron gun includes a cathode and adjustable electron optics that shape the flow of electrons into a beam of selected parameters.

13. The ion source of claim 1, 3 or 4 wherein the ion source is configured to be retrofit into an ion implanter.

14. The ion source of claim 1, 3 or 4 constructed and arranged to cause the electron beam to have a profile matched to the opening of the ion extraction aperture.

15. The ion source of claim 1, 3 or 4 in which the cross-section of the beam is generally rectangular.

16. The ion source of claim 1, 3 or 4 in which the electron beam gun and ionization chamber are constructed to operate with a voltage drop between them of about 50 and 150 electron volts.

17. The ion source of claim 1, 3, or 4 in which the ionization chamber is in thermal continuity with a vaporizer.

18. The ion source of claim 1, 3 or 4 including a vaporizer for decaborane which includes a temperature control system, and said ionization chamber is in thermal continuity with said vaporizer.

19. The ion source of claim 1, 3 or 4 in which the ionization chamber is defined within a conductive block defining a heat sink that is in thermal continuity with said vaporizer.

20. The ion source of claim 1, 3 or 4 in which the conductive block is in thermal continuity with said vaporizer via a conductive gasket at which the vaporizer may be separated from the remainder of the assembly.

21. The ion source of claim 1, 3 or 4 in which the block is comprised of graphite or aluminum.

22. The ion source of claim 1, 3 or 4 including a mounting flange for joining the ion source to the housing of an ion implanter, said ionization chamber being located on the inside of the mounting flange and a vaporizer being removably mounted to the exterior of the mounting flange via an isolation valve which is separable from the mounting flange with the vaporizer, enabling the vaporizer charge volume to be isolated by the valve in closed position during handling.

23. The ion source of claim 1, 3 or 4 in which opposite walls of the ionization chamber corresponding respectively to the electron beam gun and the beam dump have access ports through which electrons pass enroute from the electron beam gun to the beam dump, the spaces in the vicinity of said ports being surrounded by housing and communicating with a vacuum system.

24. The ion source of claim 1, 3 or 4 including a gas inlet which enables one or more compounds to be introduced to the ionization chamber for ionization.

25. The ion source of claim 1, 3 or 4 for a high current ion implanter in which the extraction aperture is of the order of two inches in height and 0.5 inch in width.

26. A method of providing ions during ion implantation comprising the steps of:
(a) introducing material comprising a gas or heated vapor to a chamber enclosing an ionization volume, the chamber having an extraction aperture; and
(b) passing through the ionization volume adjacent said aperture a broad beam of electrons aligned with a beam dump that is located outside the chamber, the energy of the electrons being selected to ionize the material.

27. A method of providing ions during ion implantation comprising the steps of:
(a) introducing material comprising a gas or heated vapor to a chamber enclosing an ionization volume, the chamber having an extraction aperture; and
(b) and passing through the ionization volume adjacent said aperture a broad beam of electrons, including extracting the electrons from an emitter and forming the beam by electron lenses.

28. The method of claim 26 or 27 in which the broad electron beam is emitted from a heated emitter surface that is remote from and thermally isolated from the ionization chamber.

29. The method of claim 26 or 27 wherein step (a) includes the steps of vaporizing decaborane, introducing the decaborane vapors to the ionization chamber, and controlling the broad electron beam parameters to ionize the decaborane and produce a decaborane current.

30. The method of providing ions of claim 26 or 27 further including the step of employing a beam dump to receive the electron beam after it transits the ionization volume, including maintaining the beam dump thermally isolated from the chamber and at a voltage potential at least as high as that of the chamber.

31. An ion source having a member whose surface is exposed to contact of a dopant feed material, including gases, vapors or ions thereof, the relationship of said contact being such that condensation or molecular dissociation will occur if the temperature of the surface of the member is not within a desired operational range, said member being disposed in conductive heat transfer relationship with a second member, the temperature of which is actively controlled.

32. The ion source of claim 31 in which the second member is water-cooled.

33. The ion source of claim 31 in which the second member is associated with a thermoelectric cooling unit associated with a control system that can activate the unit to maintain the temperature of said surface within said operational range.

34. The ion source of claim 31, 32, or 33 including a heater element arranged to cooperate with a cooler to maintain the second member at a temperature.

35. The ion source of claim 31, 32 or 33 in which the surface is a surface of an ionization chamber.

* * * * *